United States Patent
Chang et al.

(10) Patent No.: US 11,854,924 B2
(45) Date of Patent: Dec. 26, 2023

(54) SEMICONDUCTOR PACKAGE WITH IMPROVED RELIABILITY

(71) Applicant: MEDIATEK INC., Hsin-Chu (TW)

(72) Inventors: Tien-Chang Chang, Hsinchu (TW); Yan-Liang Ji, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 107 days.

(21) Appl. No.: 17/512,665

(22) Filed: Oct. 27, 2021

(65) Prior Publication Data

US 2022/0181228 A1    Jun. 9, 2022

Related U.S. Application Data

(60) Provisional application No. 63/121,268, filed on Dec. 4, 2020.

(51) Int. Cl.
```
H01L 23/495    (2006.01)
H01L 23/31     (2006.01)
H01L 23/498    (2006.01)
H01L 23/00     (2006.01)
```
(52) U.S. Cl.
CPC .... *H01L 23/3128* (2013.01); *H01L 23/49816* (2013.01); *H01L 23/49822* (2013.01); *H01L 23/49827* (2013.01); *H01L 24/06* (2013.01); *H01L 24/73* (2013.01); *H01L 2224/02331* (2013.01); *H01L 2224/73104* (2013.01)

(58) Field of Classification Search
CPC .......... H01L 23/3128; H01L 23/49816; H01L 23/49822; H01L 23/49827; H01L 24/06; H01L 24/73; H01L 2224/73104

USPC .......................................................... 257/668
See application file for complete search history.

(56) References Cited

U.S. PATENT DOCUMENTS

| | | | |
|---|---|---|---|
| 10,522,440 B2 * | 12/2019 | Wang | H01L 24/19 |
| 2011/0278736 A1 * | 11/2011 | Lin | H01L 21/568 |
| | | | 257/E21.507 |
| 2013/0154108 A1 | 6/2013 | Lin | |
| 2013/0270705 A1 | 10/2013 | Wang | |
| 2018/0269180 A1 | 9/2018 | Peng | |
| 2019/0139896 A1 * | 5/2019 | Hsu | H01L 24/19 |

FOREIGN PATENT DOCUMENTS

| | | |
|---|---|---|
| TW | 201727864 A | 8/2017 |
| TW | 201843787 A | 12/2018 |
| TW | 201929104 A | 7/2019 |

* cited by examiner

*Primary Examiner* — Caleb E Henry
*Assistant Examiner* — Dilinh P Nguyen
(74) *Attorney, Agent, or Firm* — Winston Hsu

(57) ABSTRACT

A semiconductor device includes a semiconductor die having an active surface, an opposite surface, a vertical sidewall extending between the active surface and the opposite surface, and input/output (I/O) connections disposed on the active surface. A redistribution layer (RDL) is disposed on the active surface of the semiconductor die. A plurality of first connecting elements is disposed on the RDL. A molding compound encapsulates the opposite surface and the vertical sidewall of the semiconductor die. The molding compound also covers the RDL and surrounds the plurality of first connecting elements. An interconnect substrate is mounted on the plurality of first connecting elements and on the molding compound.

10 Claims, 2 Drawing Sheets

SEMICONDUCTOR PACKAGE WITH IMPROVED RELIABILITY

CROSS REFERENCE TO RELATED APPLICATIONS

This application claims priority from U.S. provisional application No. 63/121,268 filed on Dec. 4, 2020, the disclosure of which is included in its entirety herein by reference.

BACKGROUND

The present disclosure relates generally to the field of semiconductor packaging. More particularly, the present disclosure relates to a wafer-level chip-scale package (WLCSP) with improved reliability.

The electronics industry continues to rely upon advances in semiconductor technology to realize higher-function devices in more compact areas. For many applications realizing higher-functioning devices requires integrating a large number of semiconductor devices into a single semiconductor wafer. As the number of semiconductor devices per given area of the semiconductor wafer increases, the manufacturing process becomes more difficult.

Semiconductor devices are generally manufactured using two complex manufacturing processes, i.e., front-end manufacturing, and back-end manufacturing, each involving potentially hundreds of steps. Front-end manufacturing involves the formation of a plurality of integrated circuit (IC) die on the semiconductor wafer. Each IC die is typically identical and contains circuits formed by electrically connecting active and passive components. Back-end manufacturing involves singulating individual IC die from the finished wafer and packaging the die to provide structural support and environmental isolation.

The packaging of an IC die is increasingly playing a role in its ultimate performance. For example, in mobile devices (i.e., mobile phones, tablet computers, laptop computers, remote controls, etc.), wafer-level chip-scale package (WLCSP) components are used in their assembly. WLCSP is true chip scale package with low cost by eliminating package substrate. The direct chip-to-board attach through solder joints provides low interconnect inductance and resistance, as well as improved thermal performance. These properties make WLCSP a packaging format well suited for 5G radio frequency (RF) applications where minimized package size and parasitics as well as thermal performance are critical.

Due to the dissimilar properties between chip and board, the reliability of WLCSP can be challenging. There is a desire to provide reliable WLCSP as well as simplified and cost effective methods for forming these packages.

SUMMARY

It is one object of the present invention to provide a semiconductor package with improved reliability dies in order to solve the above-mentioned prior art problems or shortcomings.

One aspect of the invention provides a semiconductor device including a semiconductor die having an active surface, an opposite surface, a vertical sidewall extending between the active surface and the opposite surface, and input/output (I/O) connections disposed on the active surface. A redistribution layer (RDL) is disposed on the active surface of the semiconductor die to rearrange the I/O connections. A plurality of first connecting elements is disposed on the RDL. A molding compound encapsulates the opposite surface and the vertical sidewall of the semiconductor die. The molding compound covers the RDL and surrounds the plurality of first connecting elements. An interconnect substrate is mounted on the plurality of first connecting elements and on the molding compound.

According to some embodiments, a thickness of the molding compound on the RDL is smaller than a height of each of the plurality of first connecting elements such that an upper portion of the each of the plurality of first connecting elements is exposed for further connection.

According to some embodiments, the interconnect substrate is a two-layer substrate comprising a first metal layer on a first surface of a core of the interconnect substrate and a second metal layer on a second surface of the core of the interconnect substrate.

According to some embodiments, the first metal layer comprises a plurality of first bond pads and the second metal layer comprises a plurality of second bond pads, which is electrically and directly connected to the plurality of first connecting elements, respectively.

According to some embodiments, the first metal layer is electrically connected to the second metal layer through a plurality of plated through holes.

According to some embodiments, the RDL has a vertical sidewall that is substantially flush with the vertical sidewall of the semiconductor die.

According to some embodiments, the semiconductor device further comprises a plurality of second connecting elements disposed on the interconnect substrate.

According to some embodiments, each of the plurality of second connecting elements has a ball width that is greater than a ball width of each of the plurality of first connecting elements.

According to some embodiments, the plurality of second connecting elements is aligned with the plurality of first connecting elements.

According to some embodiments, the plurality of second connecting elements completely overlaps with the plurality of first connecting elements.

According to some embodiments, each of the plurality of first connecting elements is located within a projection area of each of the plurality of second connecting elements.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Embodiments relate to semiconductor packages. The packages may include wafer level chip scale packages (WLCSP) having about the same size or slightly larger than the singulated bare die. The packages, as will be described later, include an encapsulation material which may include a single or multiple encapsulant layers formed thereon. The encapsulant material serves as a protection layer which prevents or minimizes damage to the semiconductor die or chip. The semiconductor die may include, but not limited to, a memory device, a logic device, a communication device, an optoelectronic device, a digital signal processor (DSP), a microcontroller, a system-on-chips (SOC) or a combination thereof. Such packages may be incorporated into electronic products or equipment, such as smart phones or computers products.

Figure 1:
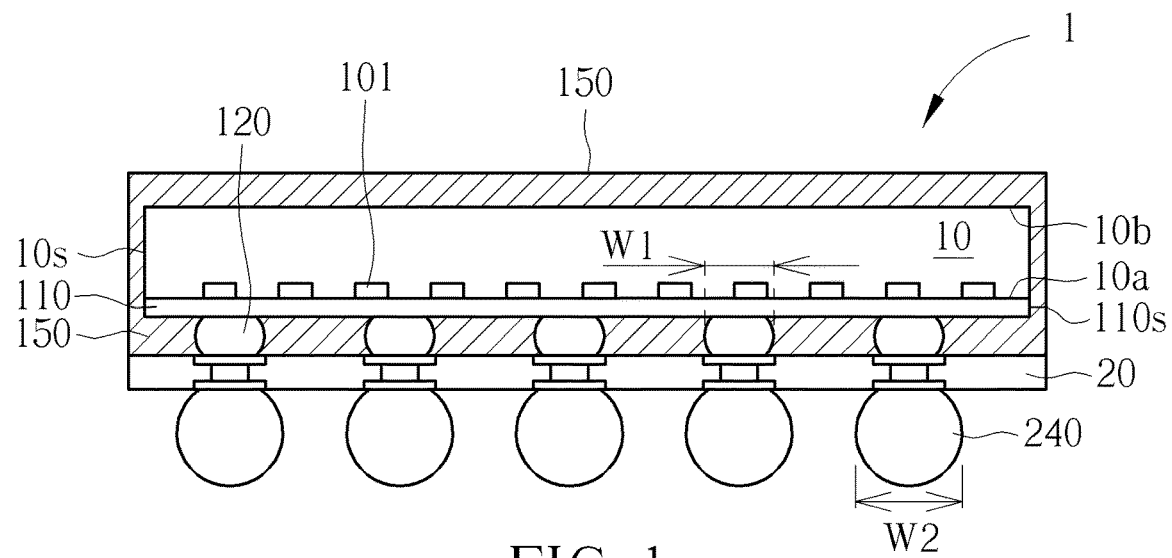
FIG. 1 is a schematic, cross-sectional diagram showing an exemplary WLCSP according to an embodiment of the invention.
Figure 2:
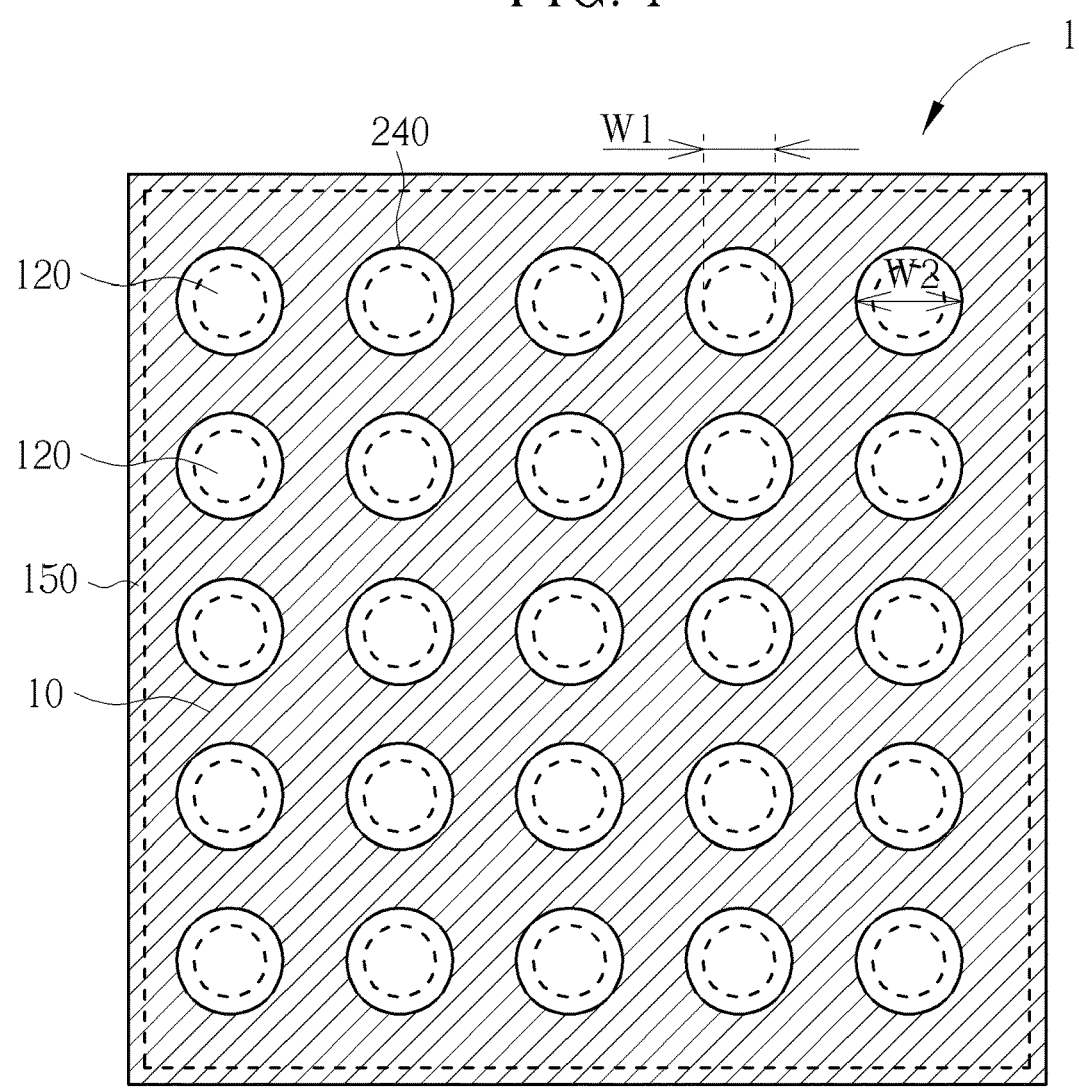
FIG. 2 is a perspective bottom view showing the relative layout of the substrate balls and the ball array on the semiconductor die.
Figure 3:
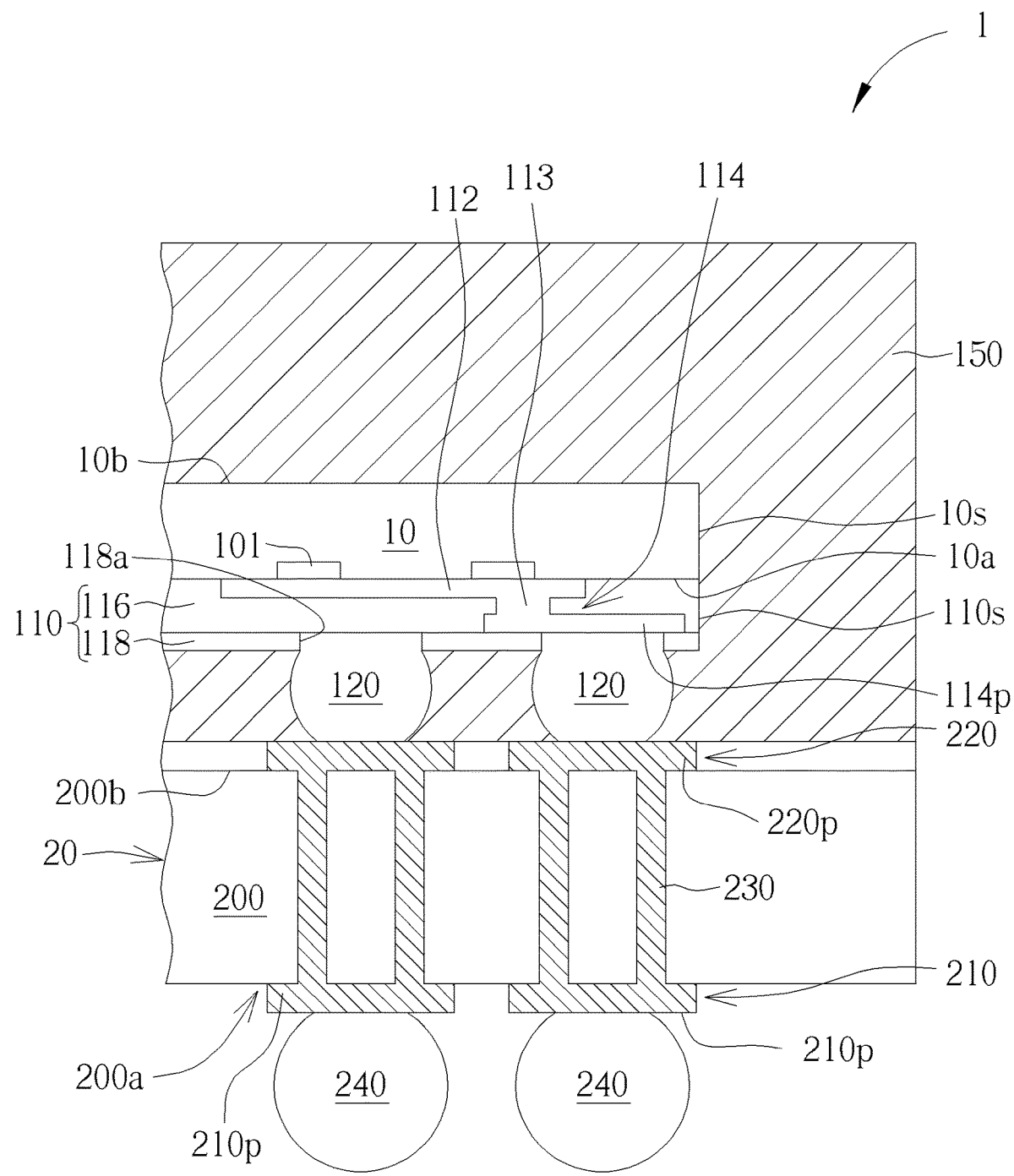
FIG. 3 is an enlarged sectional view of a part of the WLCSP.

Please refer to FIG. 1 to FIG. 3. FIG. 1 is a schematic, cross-sectional diagram showing an exemplary WLCSP according to an embodiment of the invention. FIG. 2 is a perspective bottom view showing the relative layout of the substrate balls and the ball array on the semiconductor die. FIG. 3 is an enlarged sectional view of a part of the WLCSP. As shown in FIG. 1 and FIG. 3, the semiconductor package 1 such as a WLCSP comprises a semiconductor die 10 having an active surface 10a and an opposite surface 10b. The semiconductor die 10 comprises a vertical sidewall 10s extending between the active surface 10a and the opposite surface 10b. At least one bond pad 101 is formed on the active surface 10a of the semiconductor die 10.

According to an embodiment of the invention, the semiconductor package 1 further comprises a redistribution layer (RDL) 110 disposed on the active surface 10a of the semiconductor die 10 to rearrange the input/output (I/O) connections 101 thereon.

According to an embodiment of the invention, the RDL 110 may comprise metal interconnect layers 112, 114, and at least one via layer 113 electrically connecting the metal interconnect layer with the metal interconnect layer 114. The metal interconnect layer 112 may be electrically connected to the I/O connections 101 on the active surface 10a of the semiconductor die 10. The metal interconnect layer 114 may be electrically connected to respective bond pads 114p.

According to an embodiment of the invention, the RDL 110 may comprise at least one insulating layer 116 between the metal interconnect layers 112, 114. The RDL 110 may further comprise a cap layer 118 such as a silicon nitride layer, a silicon oxide layer, or a combination thereof. An opening 118a may be formed in the cap layer 118 to partially expose each of the bond pads 114p. According to an embodiment of the invention, the RDL 110 has a vertical sidewall 110s that is substantially flush with the vertical sidewall 10s of the semiconductor die 10.

According to an embodiment of the invention, first connecting elements 120 such as solder balls are disposed on the bond pads 114p, respectively. An exemplary layout of the first connecting elements 120 on the RDL 110 is shown in FIG. 2. In FIG. 2, the first connecting elements 120 are indicated by dashed lines. For the sake of simplicity, a 5×5 ball array is shown. However, it is understood that the number and arrangement of the first connecting elements 120 depend on design requirements and may vary in different embodiments. According to an embodiment of the invention, each of the first connecting elements 120 has a ball width w1.

According to an embodiment of the invention, the opposite surface 10b and the vertical sidewall 10s of the semiconductor die 10 are encapsulated by a molding compound 150. According to an embodiment of the invention, the molding compound 150 may comprise epoxy resins and fillers, but not limited thereto. According to an embodiment of the invention, the molding compound 150 may cover the RDL 110 and surround the first connecting elements 120. According to an embodiment of the invention, the molding compound 150 may have a thickness on the RDL 110 that is smaller than a height of the first connecting elements 120 such that an upper portion of the each first connecting element 120 can be exposed for further connection.

According to an embodiment of the invention, the semiconductor package 1 further comprises an interconnect substrate 20 such as a package substrate, a printed circuit board or an interposer substrate, but not limited thereto. According to an embodiment of the invention, the interconnect substrate 20 is a two-layer substrate comprising an first metal layer 210 on an first surface 200a of a core 200 of the interconnect substrate 20 and a second metal layer 220 on a second surface 200b of the core of the interconnect substrate 20.

The first metal layer 210 comprises a plurality of bond pads 210p. The second metal layer 220 comprises a plurality of bond pads 220p, which is electrically and directly connected to the first connecting elements 120. The first metal layer 210 is electrically connected to the second metal layer 220 through a plurality of plated through holes 230.

According to an embodiment of the invention, the second connecting elements 240, such as solder balls or copper pillar bumps, etc. are disposed on the bond pads 210p, respectively. According to an embodiment of the invention, each of the second connecting elements 240 has a ball width w2 that is greater than the ball width w1 of each of the first connecting elements 120. As shown in FIG. 1 to FIG. 3, the second connecting elements 240 are aligned with the underlying first connecting elements 120, respectively.

In FIG. 2, it clearly shows that the second connecting elements 240 completely overlap with the first connecting elements 120 and that each of the first connecting elements 120 is located within a projection area of each of the second connecting elements 240 to for a ball-to-ball configuration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a semiconductor die having an active surface, an opposite surface, a vertical sidewall extending between the active surface and the opposite surface, and input/output (I/O) connections disposed on the active surface;
a redistribution layer (RDL) disposed on the active surface of the semiconductor die to rearrange the I/O connections, wherein the RDL has a dimension that is equal to a dimension of the active surface, and wherein the RDL comprises at least one insulating layer and metal interconnect layers, wherein a sidewall of the at least one insulating layer of the RDL is flush with the vertical sidewall of the semiconductor die;
a plurality of first connecting elements disposed on the RDL;
a molding compound encapsulating the opposite surface and the vertical sidewall of the semiconductor die, wherein the molding compound covers the RDL and surrounds the plurality of first connecting elements; and
an interconnect substrate mounted on the plurality of first connecting elements and on the molding compound, wherein the molding compound is in direct contact with a bottom surface of the RDL that directly faces the interconnect substrate.

2. The semiconductor device according to claim 1, wherein the interconnect substrate is a two-layer substrate comprising a first metal layer on a first surface of a core of the interconnect substrate and a second metal layer on a second surface of the core of the interconnect substrate.

3. The semiconductor device according to claim 2, wherein the first metal layer comprises a plurality of first bond pads and the second metal layer comprises a plurality of second bond pads, which is electrically and directly connected to the plurality of first connecting elements, respectively.

4. The semiconductor device according to claim 3, wherein the first metal layer is electrically connected to the second metal layer through a plurality of plated through holes.

5. The semiconductor device according to claim 1, wherein the RDL has a vertical sidewall that is substantially flush with the vertical sidewall of the semiconductor die.

6. The semiconductor device according to claim 1 further comprising:
a plurality of second connecting elements disposed on the interconnect substrate.

7. The semiconductor device according to claim 6, wherein each of the plurality of first connecting elements is a solder ball, and wherein each of the plurality of second connecting elements is a solder ball and has a ball width that is greater than a ball width of each of the plurality of first connecting elements.

8. The semiconductor device according to claim 6, wherein the plurality of second connecting elements is aligned with the plurality of first connecting elements.

9. The semiconductor device according to claim 6, wherein the plurality of second connecting elements completely overlaps with the plurality of first connecting elements.

10. The semiconductor device according to claim 6, wherein each of the plurality of first connecting elements is located within a projection area of each of the plurality of second connecting elements.

* * * * *